United States Patent [19]
DeMeester et al.

[11] Patent Number: 5,073,752
[45] Date of Patent: Dec. 17, 1991

[54] DISCRETE FOURIER TRANSFORM IMAGING

[75] Inventors: Gordon D. DeMeester, Wickliffe; Kenneth S. Denison, Shaker Hts.; Francis H. Bearden, Twinsburg, all of Ohio

[73] Assignee: Picker International, Inc., Highland Hts., Ohio

[21] Appl. No.: 510,981

[22] Filed: Apr. 19, 1990

[51] Int. Cl.$^5$ ............................................. G01R 33/20
[52] U.S. Cl. ................................... 324/309; 324/312
[58] Field of Search ............... 324/300, 307, 308, 309, 324/310, 311, 312, 313, 314

[56] References Cited

U.S. PATENT DOCUMENTS

| | | | |
|---|---|---|---|
| 4,045,723 | 8/1977 | Ernst | 324/309 |
| 4,319,190 | 3/1982 | Brown | 324/309 |
| 4,553,096 | 11/1985 | Randell et al. | 324/309 |
| 4,689,567 | 8/1987 | Maudsley | 324/309 |
| 4,721,911 | 1/1988 | Neumann | 324/309 |
| 4,748,411 | 5/1988 | Holland | 324/309 |

OTHER PUBLICATIONS

Methods and Algorithms for Fourier-Transform Nuclear Magnetic Resonance Tomography, Cho et al., J. Opt. Soc. of America, vol. 4, pp. 923-932, May 1987.
CHIRP-Z Transform Efficiently Computes Frequency Spectra, by Timothy Lyons, EDN, May 1989, pp. 161-170.
Block and Signal-Flow Diagrams for Sampled Data Control Systems, CRC Handbook of Tables for Applied Engineering Science, pp. 1067-1069, 1976.
Fourier Transform Properties, pp. 31-49.
A Three Dimensional DFT Algorithm Using the Fast Hartley Transform, Hao et al., Proceedings of the IEEE, vol. 75, No. 2, Feb. 1987, pp. 264-266.
Faster than Fast Fourier, by Mark O'Neill, BYTE, pp. 293-300, Apr. 1988.
The Structure of Vector Radix Fast Fourier Transforms, by Wu et al., IEEE Transactions, vol. 37, No. 9, pp. 1415-1424, Sep. 1989.
The Discrete Fourier Transform, pp. 32-37.
Prime Factor FFT—Fast Fourier Transform Analysis Subroutine Library brochure of Alligator Technologies.

Primary Examiner—Michael J. Tokar
Attorney, Agent, or Firm—Fay, Sharpe, Beall, Fagan, Minnich & McKee

[57] ABSTRACT

Magnetic resonance imaging data lines or views are generated and stored in a magnetic resonance data memory (56). The number of views or phase encode gradient steps N along each of one or more phase encode gradient directions is selected (70) to match the dimensions of the region of interest. A discrete Fourier transform algorithm (94) operates on the data in the magnetic resonance data memory to generate an image representation for storage in an image memory (96). Unlike a fast Fourier transform algorithm which requires $a^N$ views or data lines, where a and N are integers, the discrete Fourier transform has a flexible number of data lines and data values which can be accommodated. More specifically to the preferred embodiment, the discrete Fourier transform operation is performed by a CHIRP-Z transform or a Goertzel's second order Z-transform which can accommodate any number of data lines or values.

26 Claims, 5 Drawing Sheets

DISCRETE FOURIER TRANSFORM IMAGING

BACKGROUND OF THE INVENTION

The present invention relates to the art of medical diagnostic imaging. It finds particular application in conjunction with magnetic resonance imaging and will be described with particular reference thereto. It is to be appreciated, however, that the invention will also find application in other imaging applications in which data is transformed between frequency and time or spatial domains.

Because common discrete Fourier transforms are extremely slow, they are not generally used in computer data processing of spectrographic or analogous data. A data line with N data elements requires $N^2$ mathematical operations. In the mid 1960's, the Cooley-Tukey algorithm was developed which performed a Fourier transform operation with only $Nlog_2N$ mathematical operations commonly called a "fast Fourier transform". The fast Fourier transform algorithms were limited in that N was required to be an integer power of an integer known as the Radix value, most commonly 2. The dramatic increase in speed was considered more than worth the limitation of the length of the data lines. Note that for a data line with 512 samples (N=512), the discrete Fourier transform required over 260,000 mathematical operations whereas the fast Fourier transform only requires about 4,600. Because computing time is roughly proportional to the number of mathematical operations, the discrete Fourier transform required about 56 times as long as a fast Fourier transform to process a 512 sample line. Due to the exponent in this relationship, larger data lines achieved an even more dramatic time savings. The fast Fourier transform reduced the computing time sufficiently that fast Fourier transforms became a standard computer subroutine.

In magnetic resonance imaging in which two dimensional inverse Fourier transforms are utilized, the time savings is even more dramatic. Although magnetic resonance literature often refers to a "Fourier transform", those skilled in the art understand that a fast inverse Fourier transform computer subroutine is utilized in practice. The universal use of the fast Fourier transform is also evidenced by image sizes that are integer powers of two, such as 512×512, 256×256, etc.

The use of square image matrices is dictated by the integer power of 2 requirements of the fast Fourier transform algorithm. In medical diagnostic imaging, the regions of a human body to be imaged are rarely square. Rather, the region of interest through the torso tends to be relatively short and wide; whereas, a region of interest through the skull tends to be relatively high and narrow. To accommodate the demands of the fast Fourier transform algorithm, the field of view has commonly been selected to match the major dimension of the imaged area. The minor dimension normally being smaller than the field of view, was oversampled.

One technique for fitting a rectangular or oval patient section into a square matrix is illustrated in U.S. Pat. No. 4,748,411. In an example in which the patient fills only two thirds of the field of view, only two thirds the normal number of data lines would be collected. To accommodate the fast Fourier transform algorithm demands for a data set in which the number of samples is equal to an integer-power-of-two, additional zeros were added to the data set so that it was again a 256×256 or other integer-power-of-two square.

In the fast Fourier transform, the added zeros are a form of interpolation. In the resultant 256×256 image generated by the zero filled fast Fourier transform, the subject is stretched to fill the entire 256×256 square of the image. That is, along the phase encode direction, the data is stretched to 3/2 its prior size such that the full square is filled with only ⅔ the data. To remove the distortion, the '411 patent reduces the image by ⅔ to return it to its undistorted size. The resolution of the resultant contracted image is controlled by the increment in the phase encoding between adjacent phase encoded views.

The present invention provides a new and improved apparatus and method for generating improved quality images from data sets or matrices of arbitrary size.

SUMMARY OF THE INVENTION

In accordance with one aspect of the present invention, a set of magnetic resonance data of arbitrary dimension is operated on with a discrete Fourier transform algorithm without zero filling to an integer power of 2 to generate an image representation of corresponding dimension.

In accordance with a more limited aspect of the present invention, the discrete Fourier transform operation is carried out with a CHIRP-Z transform or Goertzel's second order Z-transform.

In accordance with another aspect of the present invention an MxN matrix of magnetic resonance data is generated, where M is an integer power of an integer and N is not. The data is transformed in the M direction with fast Fourier transform and in the N direction with a discrete Fourier transform.

In accordance with another aspect of the present invention, a magnetic resonance sequence is conducted and processed to generate a projection of a subject in the examination region in one or more directions. A size dimension in each phase encode direction is divided by a selected resolution in that direction to determine a number of corresponding phase encode gradient views.

In accordance with another aspect of the present invention, a magnetic resonance sequence is conducted and processed such that progressively finer resolution is developed in the image with each view or data line processed with a discrete Fourier transform.

One advantage of the present invention is that it reduces data acquisition time. Only the data needed to cover a given object size with a selected resolution need be taken.

Another advantage of the present invention resides in the times savings, especially in three dimensional imaging and combined imaging and spectroscopy, and echo planar imaging.

Other advantages of the present invention are the improved image quality and elimination of Gibbs and roll-over artifacts.

Still further advantages will become apparent upon reading and understanding the following detailed description.

BRIEF DESCRIPTION OF THE DRAWINGS

The invention may take form in various components and arrangements of components and in various steps and arrangements of steps. The drawings are only for purposes of illustrating a preferred embodiment and are not to be construed as limiting the invention.

FIG. 2 is a diagrammatic illustration of an imaging sequence conducted performing the present invention; and, FIGS. 3A and 3B taken together are a diagrammatic illustration of an alternate embodiment of the present invention.

DETAILED DESCRIPTION OF THE PREFERRED EMBODIMENT

Figure 1A:
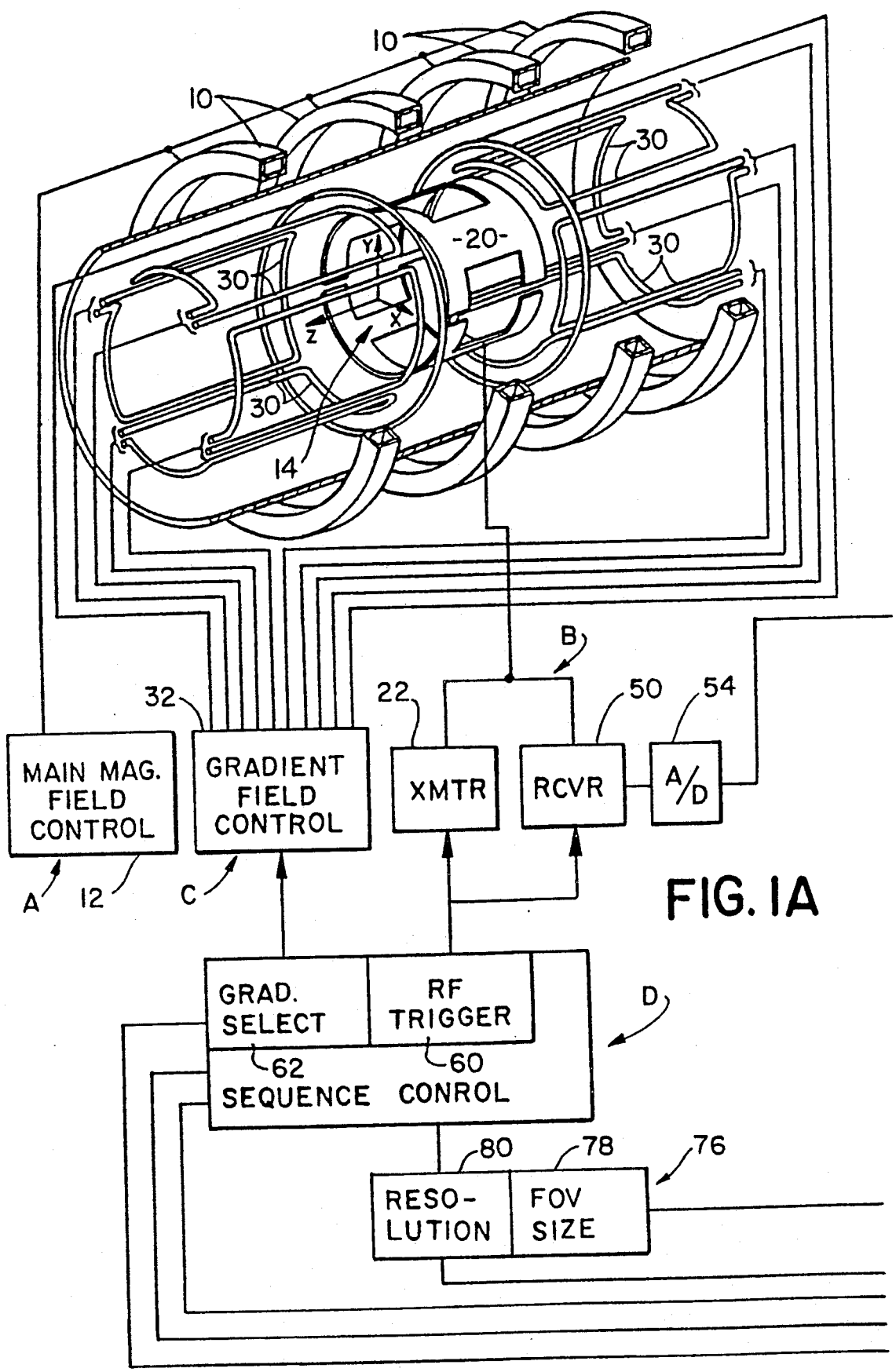
FIGS. 1 and 2 taken together are a diagrammatic illustration of a magnetic resonance imaging system in accordance with the present invention.
Figure 1B:
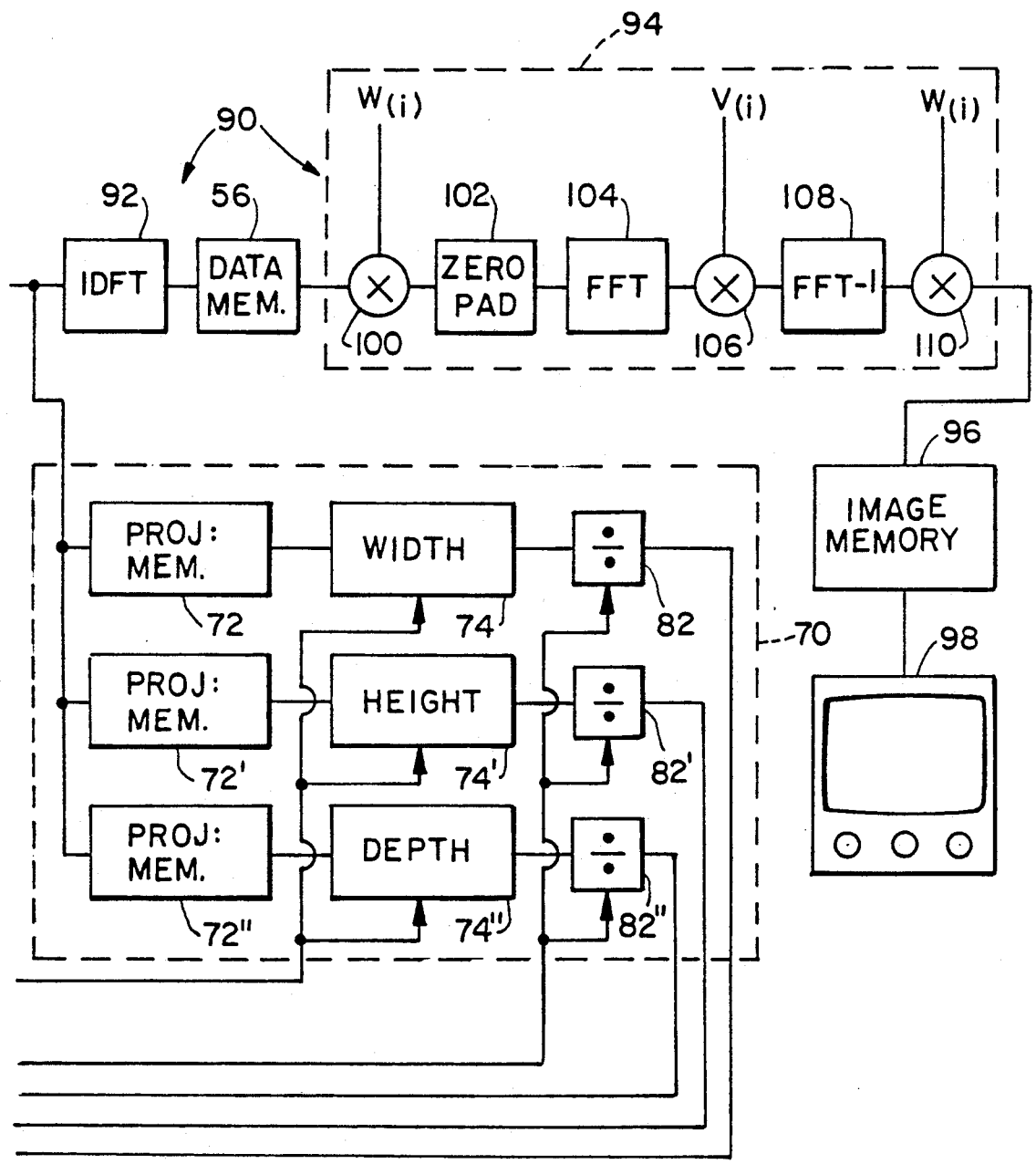

With reference to FIGS. 1A and 1B, a magnetic resonance imaging apparatus includes a main magnetic field means A for generating a substantially uniform magnetic field through an examination region. A radio frequency means B selectively transmits radio frequency excitation pulses for exciting selected dipoles within the region of interest. The radio frequency means also provides radio frequency pulses for selectively rotating or otherwise manipulating the selected components of the magnetization, e.g. selective 90° pulses, 180° pulses, or the like. A gradient field means C selectively causes gradient fields along three selectable, preferably orthogonal, axes that intersect in the examination region.

A pulse sequence control means D controls the radio frequency means and the gradient field means to cause the generation of preselected pulse sequences. The selected pulse sequence is repetitively applied but with the phase encoding gradient pulse or pulses incremented to generate differently phase encoded magnetic resonance signals or views. An imaging means E reconstructs an electronic image representation from the received magnetic resonance signals or views.

The magnetic field means A includes a control circuit 10 and a plurality of superconducting or resistive coils 12 for generating the main magnetic field. The control circuit causes the magnets to generate a magnetic field, generally on the order of 0.5 to 1.5 Tesla through an examination or image region 14. Magnetic field shimming means (not shown) as are conventional in the art are provided for rendering the magnetic field substantially uniform.

The radio frequency means B includes a radio frequency coil 20, such as a quadrature coil, which surrounds the examination region 14. A radio frequency transmitter 22 selectively applies radio frequency current pulses to the RF coil to generate the RF fields that excite magnetic resonance in selected dipoles of the examination region and manipulate the resonance.

Figure 2:
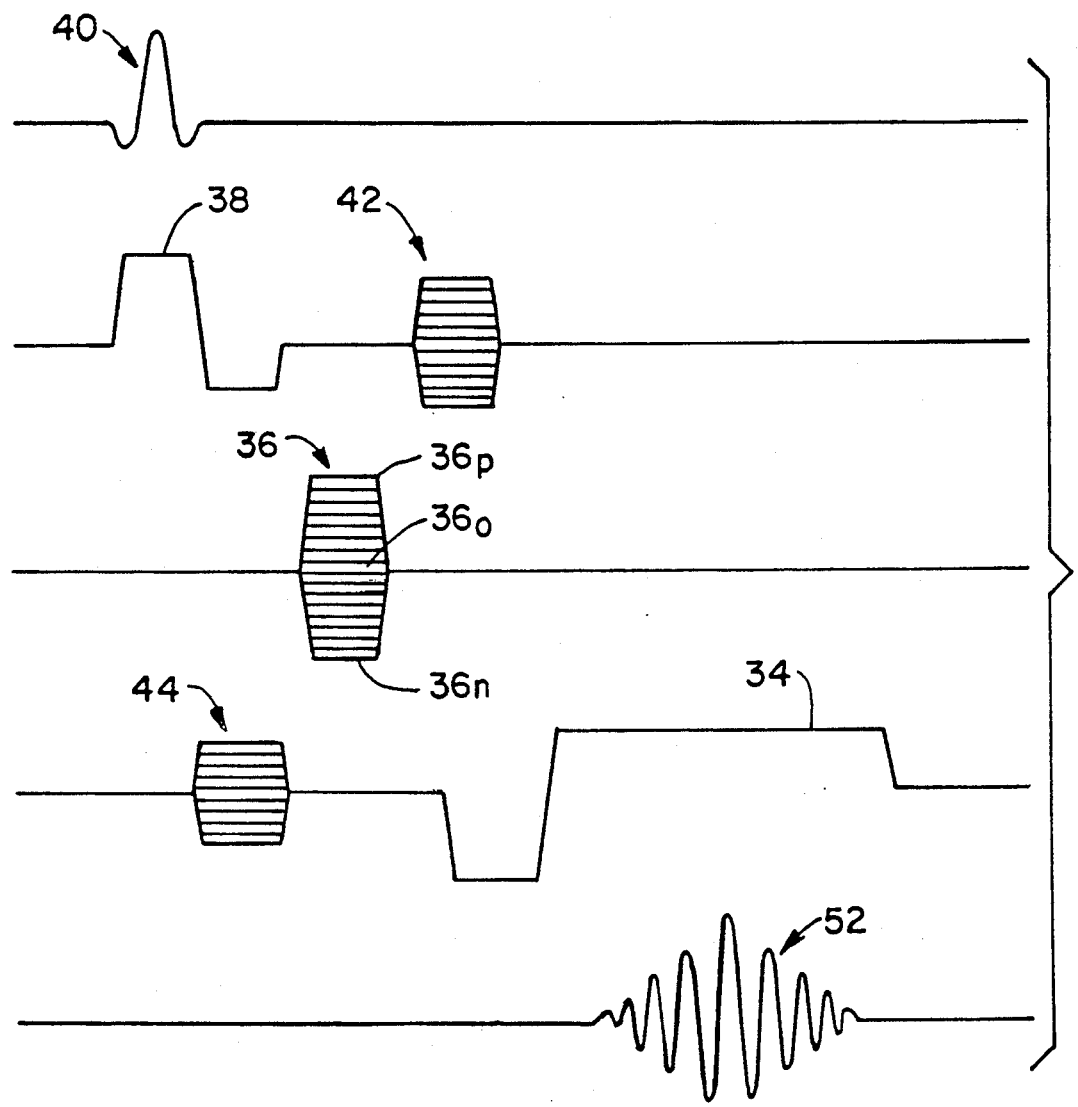

The gradient field means C includes gradient coils 30 for causing gradients across the main magnetic field with selectable slopes and durations. A gradient field control means 32 applies current pulses to the gradient coils 30 to cause gradient pulses along the three orthogonal axes. With reference to FIG. 2, the gradient field control means applies a read gradient 34 for encoding position along the read gradient in the resultant magnetic resonance signal. The gradient also applies a first phase encode gradient 36 along the phase encode axis. Commonly, in each repetition of the sequence, the magnitude of the phase encode gradient 36 is incremented or decremented to create phase encode gradients in N regular increments or steps between a negative maximum phase encode gradient 36n and a positive maximum phase encode gradient 36p and a zero phase encode gradient 36o, where N is an integer that is not an integer power of 2.

In two dimensional a common slice or slab select gradient 38 is applied along the third axis concurrently with an RF pulse 40 in each repetition. In three spatial dimensional imaging, a second phase encode gradient 42 applied along the third or slice select axis is also incremented or decremented in regular increments. Commonly, the sequence is repeated and data collected in the presence of a read gradient for each of the steps of the first phase encode gradient 36 and for each step of the second phase encode gradient 42. Thus, the total number of repetitions is the product of the number of the first and second phase encode gradient steps or increments. Three dimensional imaging also includes sequences which collect spectrographic data for each pixel of a two spatial dimension slice. The sequence is again repeated for each combination of the first and second phase encode gradient steps, but the data is collected without a read gradient such that the third dimension is a time dimension or axis. For four dimensional imaging, a third phase encode gradient 44 is also applied in steps or increments to achieve phase encoding along all three axes. Preferably, the fourth dimension is utilized to extract spectroscopic chemical analysis information for each voxel of a three or two dimensional image representation. More specifically, the voxels of the three dimensional image representation are defined by the phase encode gradients along each axis and the read gradient pulse 34 is eliminated to spread the resonance frequencies of the various constituents within each identified voxel. In the four dimensional embodiment, the number of views taken is the product of the number of gradient steps along the first, second, and third directions.

The radio frequency means B also includes a radio frequency receiver 50 that receives magnetic resonance signals during an induced magnetic resonance echo 52. The magnetic resonance signal from the receiver is digitized by an analog-to-digital converter 54 to produce individual elements of a digital data line or view for storage in a resonance data memory 56. Typically, the analog-to-digital converter is used to produce an integer-power-of-two samples, e.g. 512, to create a digital data line of suitable size for a fast Fourier transform operation. The sampling rate of the analog-to-digital converter and the amplitude of the read gradient are selected such that the digital data line or view spans the selected resolution in the read direction. The greater the number of samples for a given resolution, the larger the field of view. However, the larger the number of samples, the longer the processing and the greater the speed requirements of the analog-to-digital converter.

The sequence control means D includes a timing and pulse triggering means 60 for controlling the application of RF and gradient pulses in a selected timed relationship such as that shown in FIG. 2. A gradient pulse selection means 62 controls the amplitude of the increment between phase encode gradient steps along each of the three axes and the number of repetitions.

A patient size selecting means 70 determines one or more dimensions of a subject in the examination region. The sequence control means D conducts an imaging sequence but without an encoding gradient along a first direction of the patient to be measured. The resultant data is stored in a projection data memory 72. This data represents a projection of the patient along the first direction. A first dimension or width determining means 74 analyzes the data in the projection memory to determine a dimension or width of the subject in that direction. For example, if the width determining means operates on the data with an inverse fast Fourier transform, the result will be a one dimensional "image" representing a projection of the patient in that direction. Portions of the image corresponding to the patient will be visible while those corresponding to air will have no signal. By calibrating the portion of the one dimensional image that corresponds to the patient with dimensional data from prior scans with the same sequence, the width is readily determined. Analogously, additional projection data memories 72', 72" and additional dimension determining means 74' and 74" are optionally provided. These memories and analysis means analogously determine dimensions of the subject in other directions. The longest dimension is typically aligned with the frequency encode or read direction. Alternately, the data collection directions may be rotated and the same memory and dimension determining means may be utilized to ascertain a plurality of dimensions. The dimensions may be determined along three pre-assigned mutually orthogonal axes or may be determined along a relatively plurality of directions. An optimal orthogonal axes selecting means may be provided to analyze the dimensions of a patient in the various projections to determine an ideal orientation for the axes. An exemplary analysis of the dimensions would be to sum the dimensions of the patient in all three directions and to select the axes along which the sum of the dimensions is the lowest. An operator control panel 76 includes a control means 78 that enables the operator manually to select or override any one or more of the selected dimensions. In human imaging, the third dimension may typically be the length of the patient which is manually foreshortened to a reasonable region of interest. Alternately, in some techniques, the field of view is limited in one or more dimensions by presaturating material outside of the field of view. The field of view for the image sequence is set to match the unsaturated region.

The operator control panel further includes a means 80 for the operator to select a desired resolution, e.g. 1 millimeter. The same resolution may be selected along all three axes, although in multislice studies, the slices are commonly thicker than the selected resolution, e.g. 1.5 millimeters vs. 1 millimeter. A dividing means 82 divides the dimension to be imaged by the selected resolution. The quotient of the division indicates the number of phase encode gradient steps to be applied in the corresponding direction. The selected resolution indicates the magnitude or angle of the maximum positive phase encode gradient step 36p and the maximum negative phase encode gradient step 36n, i.e. the end points. From the end point of the phase encode gradient steps and the number of steps, the spacing or steps between adjacent gradients is readily determined by simple division, a look—up table, or the like. The number of steps and the resolution information indicative of the end point phase encode angles are conveyed to the sequence control means to control the phase encode gradients applied in each repetition of the imaging sequence.

Once the resolution has been selected, the number of phase encode steps, the increment between phase encode steps, and the like have been determined, an imaging sequence so configured is performed. Data from the receiver 50 and the analog-to-digital converter 54 is conveyed to the resonance data memory means 56 which stores a two, three, or four dimensional data set as is appropriate to the selected imaging sequence. A Fourier transform means 90 includes a first one dimensional Fourier transform means 92 and a second one dimensional transform means 94. If three or four dimensional imaging is to be conducted, third and fourth one dimensional Fourier transform means are provided in series with the first and second Fourier transform means. Alternately, the data may be passed through the same Fourier transform array processor hardware multiple times. The first one dimensional Fourier transform means 92 is configured to match the length of the data lines produced by the analog-to-digital converter 54. When the analog-to-digital converter is configured of hardware that generates data lines that are an integer power of 2, e.g. 512 sample data lines, the first Fourier transform means is preferably one dimensional fast Fourier transform means. The first one dimensional Fourier transform means 92 may be positioned either before or after the resonance data memory means 56.

The second Fourier transform means projects or distributes the one dimensional Fourier transformed data across a second dimension to create a two dimensional data matrix. To accommodate a second dimension that is other than an integer power of 2, the second Fourier transform means performs a discrete Fourier transform. In the preferred embodiment, the second Fourier transform means performs a CHIRP-Z transform. Third and fourth Fourier transform means may be provided to spread the two dimensional data into three or four dimensions. The third and fourth transform means use CHIRP-Z transforms if the dimension is other than an integer power of 2, a fast Fourier transform if the dimension is an integer power of 2, or other Fourier transforms. The CHIRP-Z transform means 94 transforms the data from the magnetic resonance data memory into an image memory means 96. The image memory is connected to a display means 98 so that the image can be displayed after being accumulated.

The CHIRP-Z transform means 94 includes a first multiplying means 100 for weighting the digital data values in the resonance data memory 90 with a first weighting function W(i). A zero padding means 102 adds zeros to increase the size of the weighted data matrix to an integer-power-of-two. A forward fast Fourier transform means 104 operates on the data with a forward fast Fourier transform algorithm. A second multiplying means 106 multiplies the fast Fourier transformed data by a second weighting function V(i), specifically a Fourier series obtained by transforming a series of exponential terms. An inverse fast Fourier transform means 108 performs a Fourier transform on the exponentially weighted data. Another multiplying means 110 multiplies the fast Fourier transformed data by the first weighting function.

The first and second weighting functions W(i) and V(i) are:

$$W(i) = \text{Cos}(-\pi * i * i/N) + j\text{Sin}(-\pi * i * i/N) \quad (1)$$
$$0 \leq i \leq N - 1$$

$$V(i) = \text{Cos}(-\pi * i * i/N) - j\text{Sin}(-\pi * i * i/N) = W(i)^* \quad (2a)$$
$$0 \leq i \leq N - 1$$

$$= \text{Cos}(-\pi * (L - i) * (L - i)/N) - \quad (2b)$$
$$j\text{Sin}(-\pi * (L - i) * (L - i)/N)$$
$$N \leq i \leq (L - 1)$$

where N is the number of digital values actually collected and L is the integer power of 2 to which the data is padded.

Alternately, other discrete fourier transforms which permit the use of non-integer powers of 2 length data lines may also be utilized. for example, for data lines with N values, a transform of the form:

$$I(x,y) = \sum_{n=0}^{N-1} F(n,l) \cos \frac{(2\pi ikn)}{N} + j\sum_{n=0}^{N-1} F(n,l) \sin \frac{(2\pi ikn)}{N} \quad (3a)$$

may be utilized, where:

$$F(n,l) = \sum_{m=0}^{M-1} F(n,m) e^{2\pi ilm/M}. \quad (3b)$$

Figure 3A:
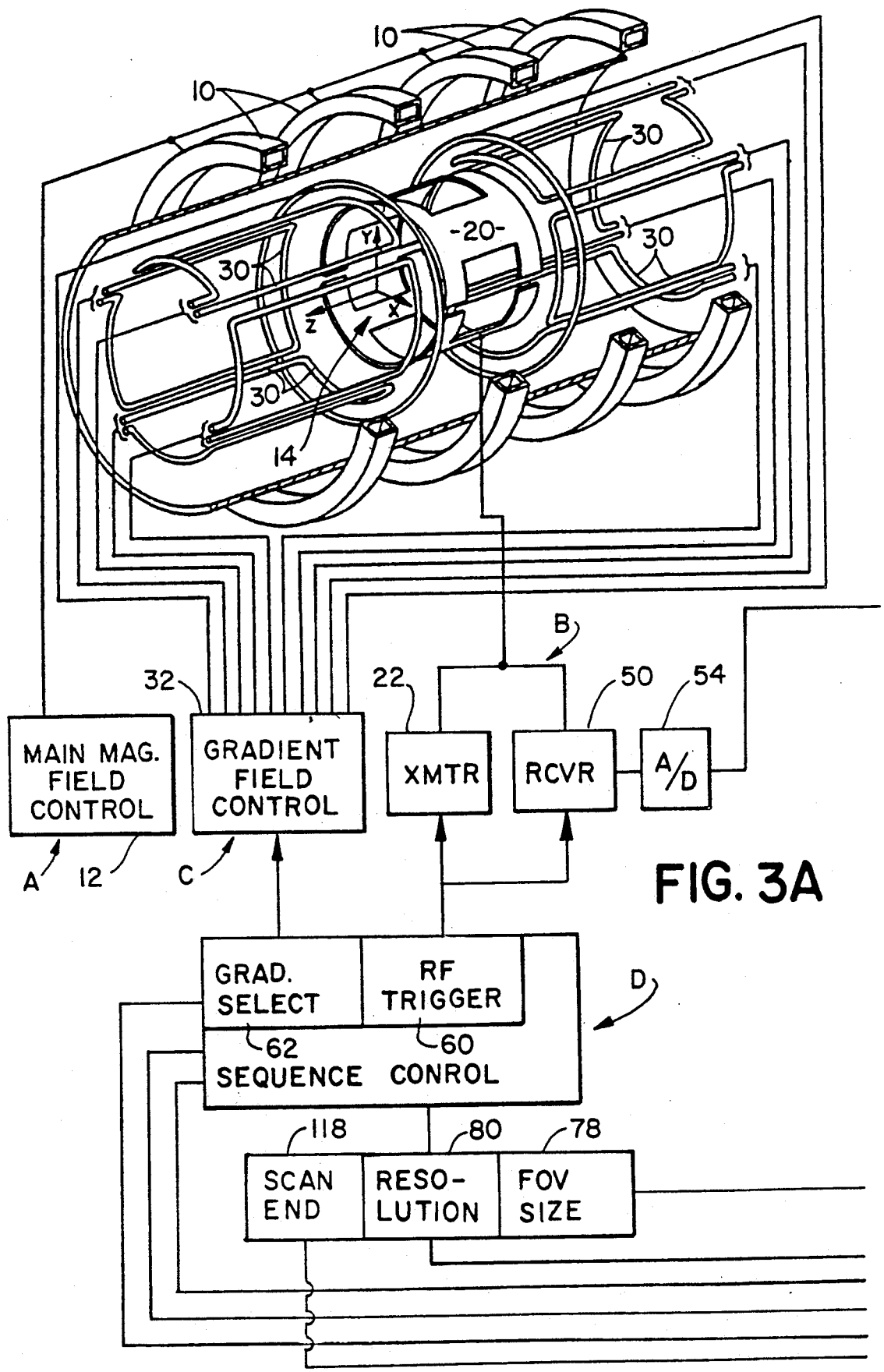
Figure 3B:
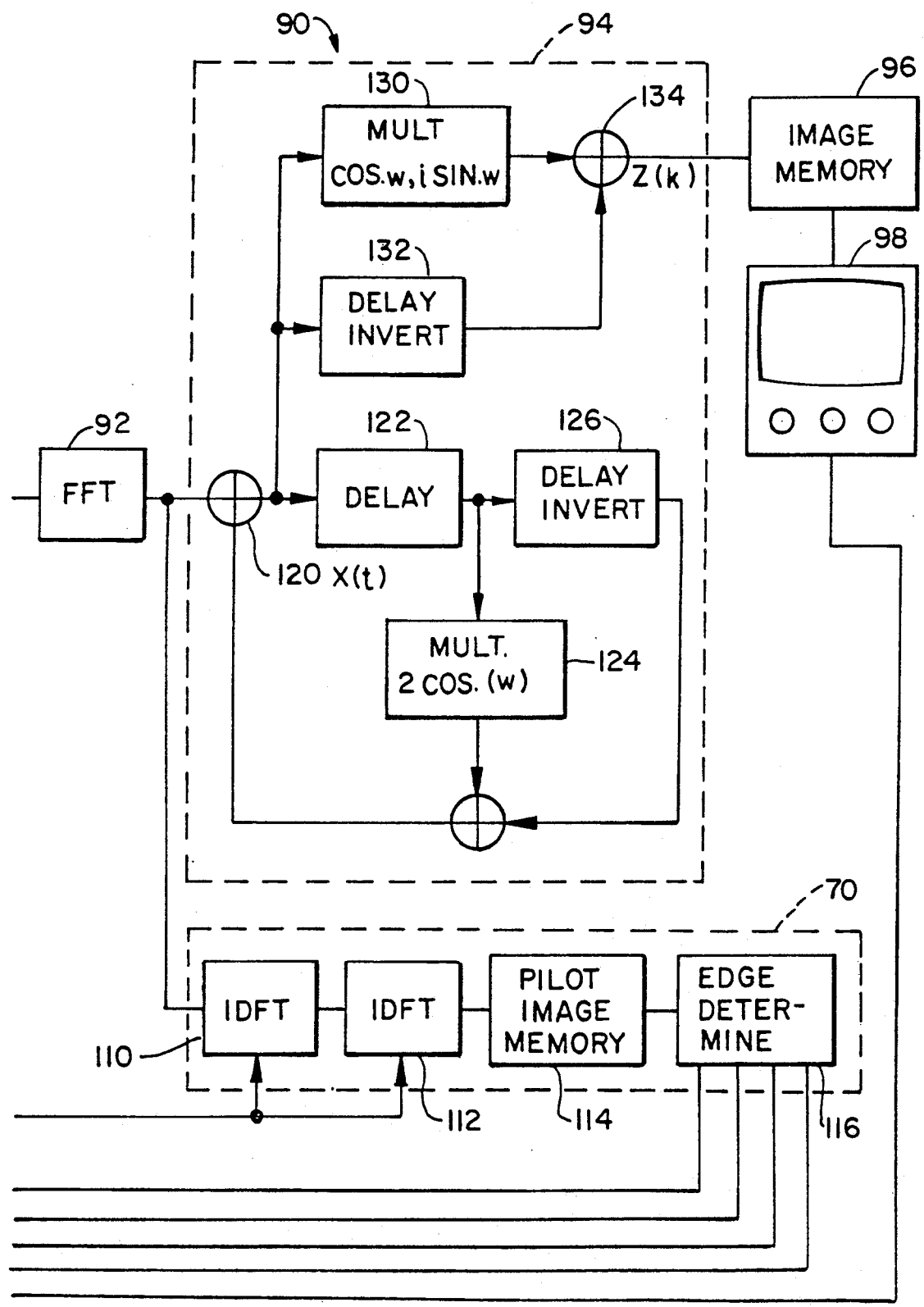

With reference to FIGS. 3A and 3B, the data from the analog-to-digital converter is received by the first Fourier transform means 92 which operates on each line of data with a fast Fourier transform algorithm. The patient size selecting means 70 includes additional Fourier transform means 110, 112 for generating a three dimensional image representation in a pilot scan image memory 104. An edge of the patient determining means 116 steps through the planes of a three dimensional pilot image representation or lines of a two dimensional pilot image representation to find the first plane or line from each edge that contains patient rather than background data. From the edges of the patient in all dimensions, the edge of the patient determining means calculates the center of the region of interest and the width, height, and depth of the subject or patient symmetrically about the center.

It is to be appreciated that the operator may select a smaller image area than the physical dimensions of the subject. However, because each resonance data value contributes through the Fourier transform operation to all pixels or voxels of the resultant image representation, the scan parameters are based on the actual physical dimensions of the subject rather than the physical dimensions of the area to be imaged. This oversampling of the image area eliminates roll-over or wrap-around image artifacts and enables the sampling interval to be selected to eliminate Gibbs ringing artifacts. Presaturation may also be utilized to eliminate signal contribution from outside of the field of view.

The second transform means 94 performs a Goertzel's second order Z-transform discrete Fourier transform algorithm. As each Fourier transformed line of data is received by the second transform means, it is weighted appropriately for each line of a two dimensional image matrix and the weighted values added to the corresponding lines of a two dimensional image representation in the image memory 96. More specifically, the image data acquisition sequence is ordered to start from the central phase encode view and work outward such that each additional view improves the resolution. The fast Fourier transform means 92 transforms each data line along the read direction and then discrete Fourier transform means 94 spreads the view over an entire two dimensional image representation as the next view is being acquired. In this manner, the resolution of the image in the scan improves in each repetition of the image sequence. A scan termination means 118 terminates the scan sequence When the resultant image representation achieves an appropriate resolution for a diagnostic study underway. In this manner, the operator can watch the image as it is being developed.

When a once Fourier transformed data line X(t) is received from the first Fourier transform means, the second transform means 94 receives its data values serially. Each data value is summed by a summing means 120 with an iteratively developed weighting function. Each weighted data value is forwarded to a delay means 122 which delays passage of the data value for one data value receiving cycle such that the delayed weighted value becomes part of the weighting multiplies the delayed data value by a cosine function, $2\cos(\omega)$. A second delay means 126 delays the data value yet another cycle and inverts it to form its negative. A summing means 128 sums the cosine weighted preceding data value with the previous data value and forwards the sum to the summing means 120 to form the next weighted data value.

In addition to forming a component for weighting subsequent data values, the weighted data value is sent to a second multiplying means 130 which multiplies its real and imaginary components by sine and cosine of $\omega$, where $\omega$ is $-2\pi(k-1)/N$. A delay and invert means 132 converts each weighted data value to its negative and holds it for one data value cycle such that a summing means 134 sums the preceding data value with the product of the cosine and sine multiplying means 130, to generate the Fourier transformed data Z(k).

For a data line X(t) having N data values, t assumes $$q(t) = [2\cos(\omega)]q(t-1) - q(t-2) + X(t) \quad (4),$$

where t assumes values from 1 to N.

The resultant transformed data line Z(k) is then:

$$Z(k) = (q(N)[\cos(\omega), j\sin(\omega)] - q(N-1))/N \quad (5).$$

The variable k also assumes values from 1 to N, $q(0) = q(-1) = 0$, and $\omega = -2\pi(k-1)/N$. It should be noted that due to the symmetry between $+\omega$ and $-\omega$, the number of passes of the data is reduced to N/2. Preferably, N is even so that the effective number of sines and cosines calculated for the unit vector are reduced. It is to be appreciated that with quadrature detected data, each data element has a real and an imaginary component.

Another embodiment of the present invention takes advantage of the fact that the views to either side of the central view are related by conjugate symmetry. That is, the view taken three phase encode steps to the positive side of the central, zero phase encode line is conjugately symmetric with the view taken three steps to the negative side. Due to the symmetry, only half the views need be taken, or slightly more to provide a smooth transition between the actually collected data and the data generated by conjugate symmetry. The actually taken and conjugately symmetric data may be transformed with the transform algorithm sequentially. Alternately, the weighted data line portion which the Goertzel algorithm adds to each subsequent line of the two dimensional data matrix may be added and a conjugately symmetric data line added. Echo planar imaging techniques are particularly amenable to high speed imaging using the conjugate symmetry properties of the data.

The invention has been described with reference to the preferred embodiment. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. A method of magnetic resonance imaging comprising:
   automatically determining a first dimension of a region of interest along a first phase encode direction;
   dividing the first dimension by a selected resolution in the first direction to determine a number of steps of a first phase encode gradient to be applied along the first direction;
   collecting magnetic resonance data lines with each of the first direction phase encode gradient steps;
   digitizing the magnetic resonance data lines; and,
   Fourier transforming on the digitized data lines in at least two dimensions to generate an image representation, the Fourier transforming step including using a discrete Fourier transform with respect to one of the dimensions.

2. The method of magnetic resonance imaging as set forth in claim 1 further including:
   during the magnetic resonance imaging data collecting step, frequency encoding the data in a read direction;
   in the digitizing step, generating an integer-power-of-two digital data values for each data line;
   and wherein the Fourier transforming step includes operating on the digital values of each data line with a one dimensional fast Fourier transform, whereby the data is Fourier transformed in the read direction with a fast Fourier transform and Fourier transformed in a phase encode direction with the discrete Fourier transform.

3. The method as set forth in claim 1 further including during the magnetic resonance data line collecting step, phase encoding the data lines with each of a second plurality of phase encode gradient steps along a second direction and Fourier transforming the data to the second phase encode direction to generate spectroscopic information for to each of a plurality of discrete areas of the region of interest.

4. The method as set forth in claim 1 wherein the step of using the discrete Fourier transform includes operating on the data with a CHIRP-Z transform.

5. The method as set forth in claim 1 wherein the step of using the discrete Fourier transform includes operating on the data with Goertzel's second order Z-transform.

6. A method of three dimensional magnetic resonance imaging comprising:
   a) inducing magnetic resonance in selected dipoles;
   b) applying phase encode gradients along first and second axes;
   c) collecting a magnetic resonance signal in the presence of a read gradient along a third axis;
   d) digitizing the magnetic resonance signal to generate digital data lines;
   e) repeating steps (a)-(d) for each of a plurality of phase encode gradients along each axis;
   f) Fourier transforming the digital data lines in three dimensions to create a three dimensional volume image representation, the Fourier transforming step including applying a discrete Fourier transform with respect to at least one of the dimensions.

7. A method of three dimensional magnetic resonance imaging comprising:
   a) inducing magnetic resonance in selected dipoles;
   b) applying phase encode gradients along first and second axes;
   c) collecting a magnetic resonance signal in the absence of a magnetic gradient along a third axis;
   d) digitizing the magnetic resonance signal to generate digital data lines;
   e) repeating steps (a)-(d) for each of a plurality of phase encode gradients along each axis;
   f) Fourier transforming the digital data lines in three dimensions to create a spectrographic representation corresponding to each pixel of a two dimensional spatial array, the Fourier transforming step including applying a discrete Fourier transform with respect to at least one of the dimensions.

8. A method of four dimensional magnetic resonance imaging comprising:
   a) inducing magnetic resonance in selected dipoles;
   b) applying phase encode gradients along first, second and third axes;
   c) collecting a magnetic resonance signal in the absence of a magnetic field gradients;
   d) digitizing the magnetic resonance signal to generate digital data lines;
   e) repeating steps (a)-(d) for each of a plurality of different phase encode gradients along each axis;
   f) Fourier transforming the digital data lines in four dimensions to create spectrographic analysis data corresponding to each voxel of a three dimensional spatial array, the Fourier transforming step including applying a discrete Fourier transform with respect to at least one of the dimensions.

9. A magnetic resonance method comprising:
   generating N lines of magnetic resonance image data, where N is a plural, non-integer power of an integer;
   operating on each digital data line with a one dimensional fast Fourier transform algorithm to generate N Fourier transformed data lines;
   operating on the Fourier transformed data lines with a discrete Fourier transform algorithm to generate a transformed data array;
   generating a man-readable display from the transformed data.

10. The method as set forth in claim 9 further including operating on the data array with a second discrete Fourier transform operation to spread data values into a three dimensional array of data values representing one of (1) spectrographic information corresponding to each pixel of a two dimensional region of interest and (2) information corresponding to each voxel of a three dimensional volume of interest; and,
    wherein the step of generating the man-readable display includes generating a man-readable display from selective portions of the data in the three dimensional array.

11. The method as set forth in claim 9 further including the step of automatically determining a dimension of a subject to be imaged in at least one phase encode direction.

12. The method as set forth in claim 9 wherein the step of generating the N data lines includes generating a data line with a central phase encoding and data lines with progressively greater phase encoding incremented in regular phase encoding steps to either side of the centrally phase encoded data line; and, wherein the step of generating a man-readable display is conducted concurrently with the step of operating on the data lines with the discrete Fourier transform to generate an image which develops a progressively finer resolution as additional data lines are generated and discretely Fourier transformed.

13. The method as set forth in claim 9 wherein the discrete Fourier transforming step includes operating on the data lines with one of an inverse CHIRP-Z transform algorithm and an inverse Goertzel's second order Z-transform.

14. A magnetic resonance method comprising:
generating N data lines of a magnetic resonance image data where N is a plural, non-integer power of an integer, the N data lines including a central phase encoded data line and data lines with phase encodings in regular phase encoding steps;
operating on the data lines progressively from the central phase encoded data line outward with inverse Fourier transform algorithms including at least one discrete inverse Fourier transform algorithm to generate an image representation that develops progressively to finer resolution as additional data lines are generated and Fourier transformed.

15. The method as set forth in claim 14 wherein the discrete Fourier transform operating step includes operating with a Goertzel's second order Z-transform.

16. The method as set forth in claim 14 further including monitoring the image for an appropriate resolution for a selected diagnostic image evaluation and terminating the generating of data lines in responds thereto.

17. A magnetic resonance method comprising:
generating N lines of magnetic resonance data, where N is a plural, non-integer power of an integer;
multiplying each of the data values of the N data lines by a first weighting function;
zero padding a matrix of the N data lines from a dimension of N to a dimension of L, where L is an integer that is an integer-power-of-two;
operating on the zero padded matrix with a fast Fourier transform algorithm to generate a fast Fourier transformed data matrix;
operating on the data of the fast Fourier transformed data matrix with a second weighting function;
operating on the data operated upon by the second weighting function with a second fast Fourier transform algorithm to create a second fast Fourier transformed data matrix; and,
generating an image representation with the second fast Fourier transformed data.

18. The method as set forth in claim 17 wherein the first and second weighting functions are sinusoidally varying weighting functions having real and imaginary components.

19. The method as set forth in claim 17 wherein the second weighting function includes a complex conjugate of the first weighting function.

20. A magnetic resonance method comprising:
generating at least a two dimensional array of magnetic resonance data;
operating on the data array with at least a first one dimensional Fourier transform algorithm to generate Fourier transformed lines and operating on the lines of Fourier transformed data with a second Fourier transform algorithm to spread the data over a two dimensional matrix, one of the Fourier transform algorithms being an inverse discrete Fourier transform algorithm and another being an inverse fast Fourier transform algorithm.

21. In a method of magnetic resonance imaging in which N and only N data lines are directly operated on by a Fourier transform algorithm, the improvement comprising N being an integer other than an integer power of an integer.

22. A magnetic resonance examination apparatus comprising:
a means for generating a plurality of data lines which are phase encoded with each of N incremental phase encode gradient steps, where N is a plural integer that is a noninteger power of an integer;
a Fourier transform means for operating on each data lines with a first Fourier transform algorithm to generate Fourier transformed data lines and on the Fourier transformed data lines with a second Fourier transform algorithm to distribute the Fourier transformed data lines over a transformed data array, one of the first and second Fourier transform algorithm being a discrete Fourier transform.

23. The apparatus as set forth in claim 22 wherein the means for generating the data lines includes an analog-to digital converter means for converting analog magnetic resonance data into digital data values of each data line, the number of digital data values in each data line being an integer power of an integer and wherein the first Fourier transform algorithm is a fast Fourier transform algorithm.

24. The apparatus as set forth in claim 22 further including:
a means for determining a dimension of a region of interest being imaged in at least one phase encode direction;
a means for determining N by operating on the measured dimension with a selected resolution.

25. The apparatus as set forth in claim 22 wherein the Fourier transform means includes:
means for operating on the data lines with a first weighting function:
a zero padding means for adding zero magnitude data lines to increase a dimension of a matrix of the image data from N to an integer-power-of-two;
a first fast Fourier transform means for operating on the zero padded data with a fast Fourier transform algorithm;
a means for operating on the fast Fourier transformed data with a second weighting function;
a second fast Fourier transform means operatively connected with the second weighting function operating means for operating on the weighted data with a second fast Fourier transform algorithm;
a means for operating on the data from the second fast Fourier transform means with a weighting function.

26. The apparatus as set forth in claim 22 wherein the discrete Fourier transform algorithm is at least one of a CHIRP-Z transform and a Goertzel's second order Z-transform.

* * * * *